United States Patent [19]

Lin et al.

[11] Patent Number: 5,551,571
[45] Date of Patent: Sep. 3, 1996

[54] SEMICONDUCTOR WAFER CONTAINER

[75] Inventors: Jenq-Tyan Lin, Kaohsyung; Horng-Huei Tseng, Hsin Chu, both of Taiwan

[73] Assignee: Vanguard International Semiconductor Corp., Hsinchu, Taiwan

[21] Appl. No.: 529,634

[22] Filed: Sep. 18, 1995

[51] Int. Cl.⁶ .................................................. B65D 85/90
[52] U.S. Cl. ........................... 206/710; 53/449; 206/445; 206/499
[58] Field of Search ................... 53/443, 449; 206/445, 206/454–456, 499, 710–712

[56] References Cited

U.S. PATENT DOCUMENTS

| | | | |
|---|---|---|---|
| 4,787,508 | 11/1988 | Wu et al. | 206/710 |
| 4,804,086 | 2/1989 | Grohrock | 206/710 |
| 5,366,079 | 11/1994 | Lin et al. | 206/328 |
| 5,452,795 | 9/1995 | Gallagher et al. | 206/711 |
| 5,454,468 | 10/1995 | Chou et al. | 206/710 |
| 5,482,161 | 1/1996 | Williams et al. | 206/711 |

*Primary Examiner*—Jimmy G. Foster
*Attorney, Agent, or Firm*—George O. Saile; Wolmar J. Stoffel

[57] ABSTRACT

A new combination container for wafers, and a retainer element to prevent movement of the wafers in the container, is described. The container has a body member with a circular base with a flat upper surface for supporting stacked wafers, and an upright arcuate member on the base that is adapted to encircle approximately 180° of the stack of wafers. An enclosure member with a top and a cylindrical wall mates with the body member to enclose the upright member and a stack of wafers. A suitable means is provided to secure the body member and enclosure member together in sealed relationship. The wafer carrier of the invention improves the handling and storage of large diameter semiconductor wafers, is easier to load and unload, and can be opened and closed with a minimum of effort and a reduced probability of damaging the wafers.

23 Claims, 5 Drawing Sheets

SEMICONDUCTOR WAFER CONTAINER

BACKGROUND OF THE INVENTION (1) Field of the Invention

The present invention relates generally to semiconductor wafer handling and storage, and more particularly to a new wafer container that facilitates loading and unloading large size wafers.

(2) Description of the Prior Art

The transport and storage of semiconductor wafers has presented more problems as the diameter of the wafers has increased in size, and the circuitry has become more microminiaturized. The wafer size has increased from one and a quarter inches in diameter to eight inches in diameter. The metallurgy on the wafer and the thickness of the protective insulation layers has at the same time decreased by orders of magnitude. These developments have produced wafers that have a much greater mass, and a circuitry structure that is much more sensitive to stress, vibration and abrasion.

U.S. Pat. No. 5,366,079 to Lin represents a recent improvement in wafer carriers that is designed for storing and transporting semiconductor wafers having large diameters. However, some difficulty has been experienced in the loading and unloading of the wafer carrier. In loading, the wafer must be grasped with a vacuum pen, or similar implement, and either lowered into the container, raise through a top opening. This presents the possibility of dropping the wafer and damaging both the wafer that falls, as well as the wafer absorbing the shock. In addition, in placing the wafer on the stack of wafers in the container an edge of the wafer can scrape the surface of the top wafer in the stack to damage the wafer. In addition, lowering the wafers through a top opening is a time consuming and tedious task.

SUMMARY OF THE INVENTION

It is an object of the invention to provide an improvement in the handling and storage of large diameter semiconductor wafers.

Another object of the invention is to provide a container for wafers that is easier to load and unload.

Yet another object of the invention is to provide a wafer carrier that can be opened and closed with a minimum of effort and a reduced probability of damaging the wafers.

In accordance with afore-mentioned objectives there is presented a new combination container for wafers and a retainer element to prevent movement of the wafers in the container. The container has a body member with a circular base with a flat upper surface for supporting stacked wafers, and an upright arcuate member on the base that is adapted to encircle approximately 180° of the stack of wafers. An enclosure member with a top and a cylindrical wall mates with the body member to enclose upright member and a stack of wafers. A suitable means is provided to secure the body member and enclosure member together in sealed relationship.

DETAILED DESCRIPTION OF THE PREFERRED EMBODIMENTS

Figure 1:
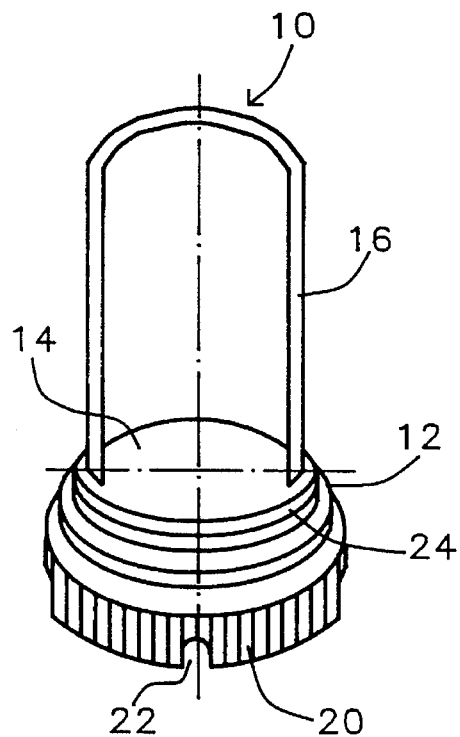
FIG. 1 is a perspective view of the body member of the container of the invention.
Figure 2:
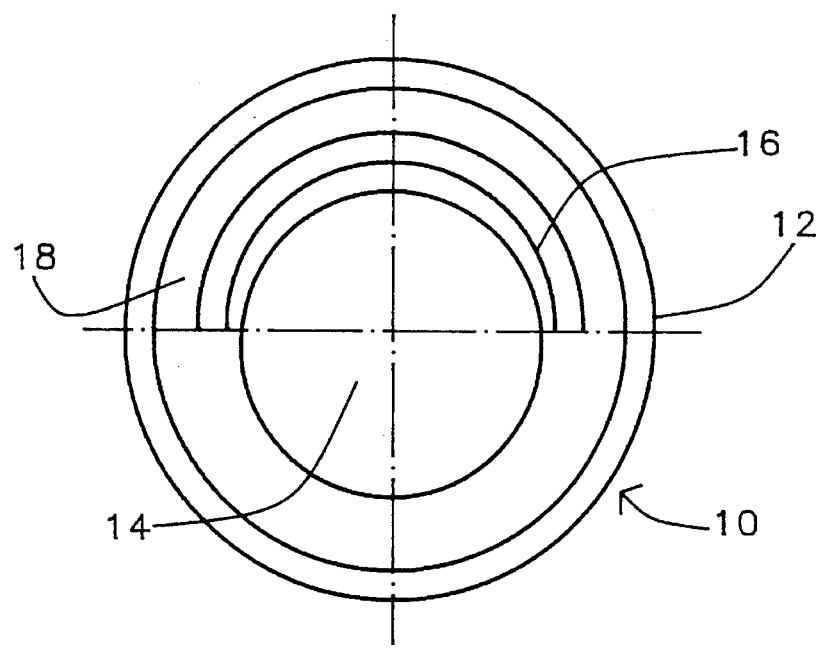
FIG. 2 is a top view of FIG. 1.
Figure 3:
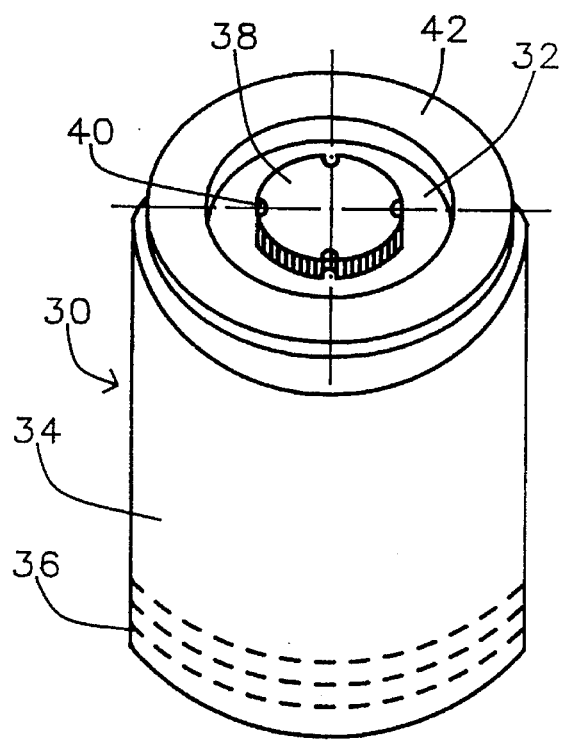
FIG. 3 is a perspective view of the enclosure member of the container of the invention.
Figure 4:
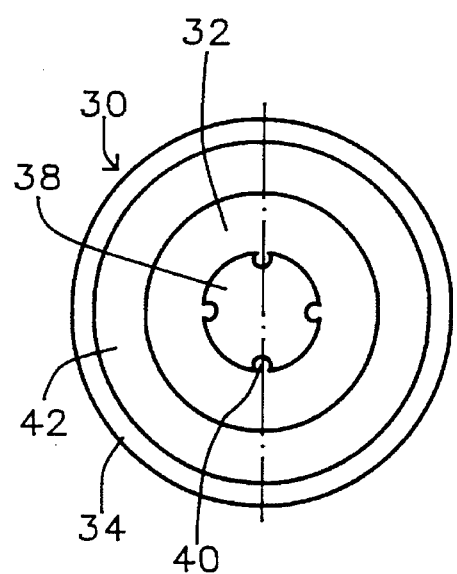
FIG. 4 is a top view of FIG. 3.

Referring now to the drawings, FIG. 1 shows a preferred embodiment of the body member 10 of the wafer container. Body member 10 has a circular base 12 having a flat upper surface 14 adapted to support a stack of semiconductor wafers. An arcuate upright member 16 is supported on and attached to the flat surface 14 of base 12. Member 16 is adapted to encircle approximately 180° of a stack of wafers on base 12. The member 16 is preferably adjacent 2 mm in thickness and conform closely to a circular wafer. Obviously the curvature of member 16 must be adapted to closely contact the wafer. As shown more clearly in FIG. 2, member 16 is spaced inwardly from the edge of surface 14. A preferred spacing 18 is approximately 2 mm. Base 12 preferably has a fluted peripheral surface to provide a better grip when opening or closing the container. A slot or slots 22 is also provided in the bottom surface of the base 12 which will be explained in more detail later. Male threads 24 are provided on the base 12 to secure the enclosure member 30, shown in FIG. 3, to the base. Enclosure member 30 has a circular top wall 32 attached to a cylindrical wall 34. Member 30 has female threads 36 that engage with threads 24 on base 12. The length of cylindrical wall 34 of enclosure 30 is such that upright member 16 is in close proximity to or in engatement with the inside surface of the circular top wall 32 when enclosure member is secured to the body member 10. Preferably a protuberance 38 is located on top wall 34. The protuberance is adapted to interact with a wrench, or the like, to facilitate the application of torque to enclosure member 30 when removing or attaching member 30. A preferred protuberance shape is illustrated in FIG. 3, consisting of spaced detents 40. A flange 42 is preferably provided on the top wall 32 for strength, and also to provide a more stable surface for setting the enclosure on a surface when it is removed from the body member.

Figure 5:
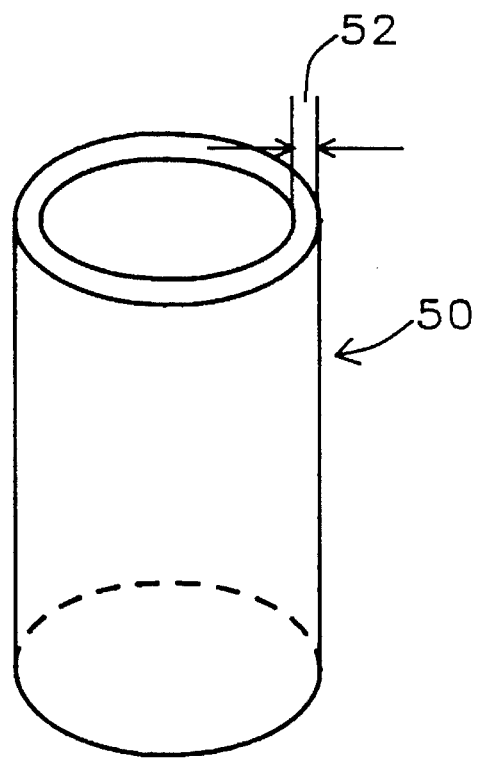
FIG. 5 is a perspective view of the retainer element of the container of the invention.

A cylindrically shaped retainer element 50 is illustrated in FIG. 5. Element 50 is the same length as upright member 16 on body member 10. Element 50 is adapted to encircle upright member 16 and a stack of wafers supported on base 12. The bottom edge of element 50 rests on the outside peripheral top surface 14 of base 12. Element 50 is formed of a relatively soft pliable material such as foam rubber or plastic. The material should be anti-static in order to prevent the discharge of static electricity. The preferred thickness 52 of element 50 is 2 mm.

Figure 6:
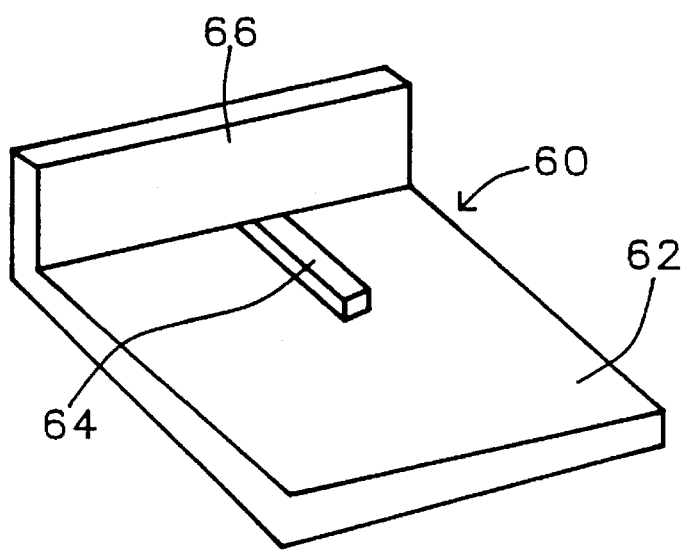
FIG. 6 is a perspective view of a fixture that can be used to facilitate opening the container of the invention.

Referring now to FIG. 6, there is illustrated a fixture 60 to facilitate opening or closing the container of the invention. Fixture 60 has a flat support panel 62 provided with a ridge element 64. Ridge element 64 is adapted to fit into slot 22 in the base of body member 12. An upright abutment panel 66 is joined to panel 62. The wafer container is set on fixture 60 with ridge element in engagement with slot 22. This arrangement prevents rotation of the body member 12 as a torque force is applied to enclosure member 30 as it is removed or secured.

The body member 10 and enclosure member 30 can be made of any suitable material. Preferably the members are made of plastic that is anti-static. The electrical conductivity of the material must be sufficiently high that static electricity is not stored. A preferred material is polypropylene or similar thermoplastic material.

In use suitable cushion elements (not shown) are placed between the wafers. The cushion elements are normally made of dust free paper, foamed plastic or the like.

Figure 7:
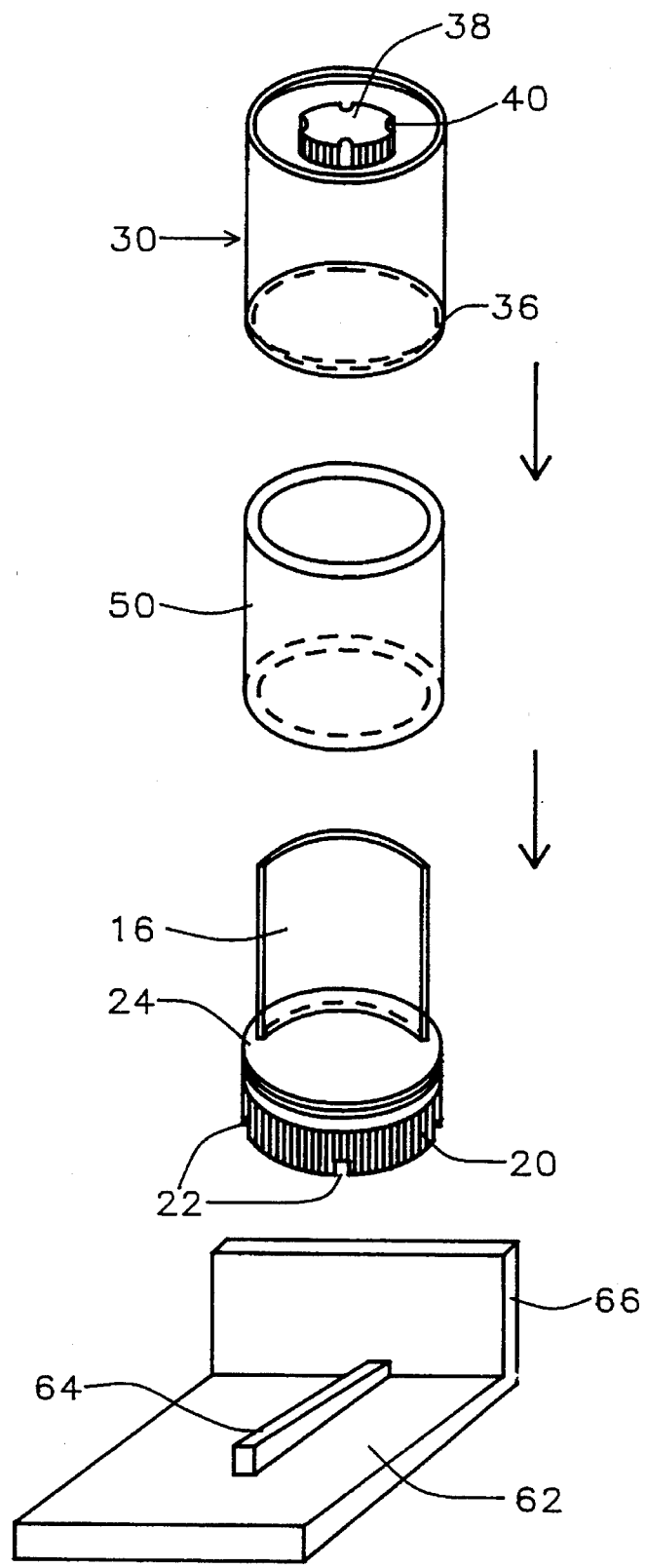
FIGS. 7, 8 & 9 show the method of operating the container of the invention.
Figure 8:
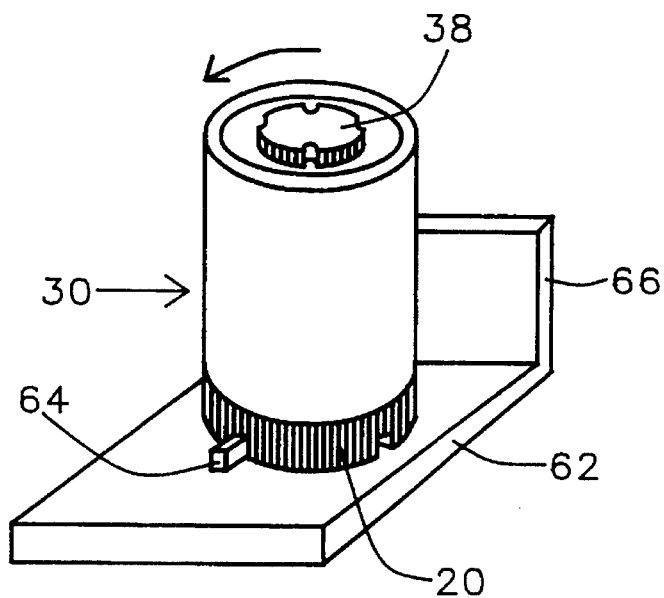
Figure 9:
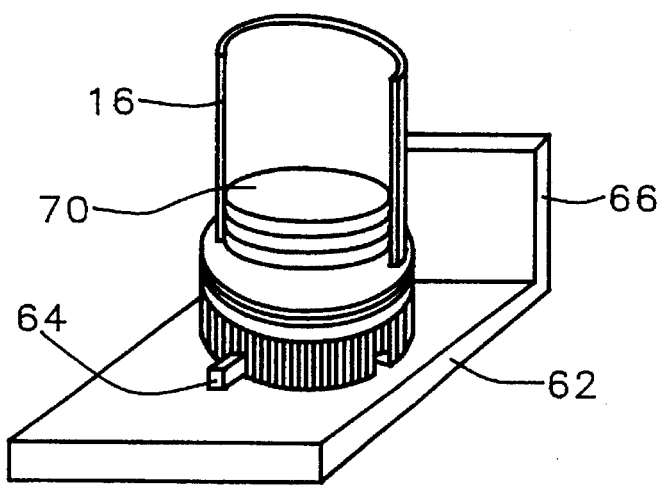

Referring now to FIGS. 7, 8 and 9, there is shown a method for carrying and removing integrated circuit wafers from a container. A body member 16 having circular base, a flat upper surface on said base for supporting wafers 70 in stacked relation, an arcuate upright member 16 on said base adapted to encircle approximately 180° of a stack of wafers 70 supported on said flat upper surface is provided. An enclosure member 30 having a circular top wall and a cylindrical wall adapted to mate with the body member 16 to form a complete enclosure for wafers 70 is provided. A means is provided to secure the enclosure member 30 to said body member 16. The means can be mating threads 24 and 36. A cylindrically shaped retainer element 50 is provided to retain wafers 70 positioned on the enclosure member 30 adapted to be placed on the base of the body member to encircle the arcuate upright member 16. The retainer element is of a length approximately equal to the length of the arcuate upright member 16. A diametrial slot 22 in the bottom surface of the base is provided. A fixture is provided for opening the container, wherein the fixture has a flat support panel 62, an upright abutment panel 66, and a ridge element 64 on the support panel that interacts with said diametral slot 22 in the base element to prevent rotation of the body member.

FIG. 7 shows the manner in which the elements 30, 50 and 16 are brought together as indicated by arrows. The manner in which the container is opened can be seen in FIGS. 8 and 9. The enclosure member 30 is rotated as indicated by the arrow until it can be removed from said base. The enclosure member 30 and retainer enclosure element 50 are removed as seen in FIG. 9. The wafers 70 may now easily be removed from the stack of wafers by means of a vacuum wafer handler.

A protuberance 38 on the top surface of the enclosure member 30 may be provided that is adapted to interact with means for the purpose of applying a torque force to the enclosure member and aid in removing the enclosure member. The protuberance 38 may be annular in shape with a plurality of detents 40 in the edges.

While the invention has been particularly shown and described with reference to the preferred embodiments thereof, it will be understood by those skilled in the art that various changes in form and details may be made without departing from the spirit and scope of the invention.

What is claimed is:

1. A container for integrated circuit wafer comprising:
    a body member having a circular base, a flat upper surface on said base for supporting wafers in stacked relation, an arcuate upright member on said base, adapted to encircle approximately 180° of a stack of wafers supported on said flat upper surface;
    an enclosure member having a circular top wall and cylindrical wall adapted to mate with said body member to form a complete enclosure for wafers, a means to secure said enclosure member to said body member; and
    a cylindrically shaped retainer element adapted to be placed on said base of said body member to encircle said arcuate upright member, said retainer element of a length approximately equal to the length of said arcuate upright member.

2. The container of claim 1 wherein said means to secure said enclosure member to said body member is a male threaded portion on said base, and a female threaded portion on said enclosure member.

3. The container of claim 2, which further includes at least one or more diametral slots in the bottom surface of said base.

4. The container of claim 3 in combination with a fixture for opening the container, said fixture having flat support panel, an upright abutment panel, and a ridge element on said support panel that interacts with said diametral slot in said base element to prevent rotation of said body member.

5. The container and fixture combination of claim 4 which further includes a protuberance on the top surface of said enclosure member that is adapted to interact with a means for the purpose of applying a torque force to said enclosure member.

6. The container and fixture combination of claim 5 wherein said protuberance is annular in shape with a plurality of detents in the edges.

7. The container of claim 1 wherein said base of said body member is provided with a fluted surface.

8. The container of claim 7 which further includes a protuberance on the top surface of said enclosure member that is adapted to interact with a wrench element for the purpose of applying a torque force to said enclosure member.

9. The container of claim 8 which further includes a flange on the top surface of said enclosure member that surrounds said protuberance.

10. The container of claim 1 wherein said retainer element is formed of foamed plastic material.

11. The container of claim 1 wherein said body member and said enclosure member are formed of anti-static plastic material.

12. The container of claim 11 which further includes circular pad elements for insertion between wafers supported on said body member.

13. The container of claim 12 wherein said pad elements are formed of foamed plastic material.

14. A container for integrated circuit wafers comprising:
    a body member having a circular base, a flat upper surface on said base for supporting wafers in stacked relation, an arcuate upright member on said base, adapted to encircle approximately 180° of a stack of wafers supported on said flat upper surface;
    an enclosure member having a circular top wall and a cylindrical wall adapted to mate with said body member to form a complete enclosure for wafers, a means to secure said enclosure member to said body member;
    a cylindrically shaped retainer element adapted to be placed on said base of said body member to encircle said arcuate upright member, said retainer element of a length approximately equal to the length of said arcuate upright member, and a diametral slot in the bottom surface of said base.

15. The container of claim 14 in combination with a fixture for opening the container, said fixture having flat support panel, an upright abutment panel, and a ridge element on said support panel that interacts with said diametral slot in said base element to prevent rotation of said body member.

16. The container and fixture combination of claim 15 which further includes a protuberance on the top surface of said enclosure member that is adapted to interact with a wrench element for the purpose of applying a torque force to said enclosure member.

17. The container and fixture combination of claim 16 wherein said protuberance is annular in shape with a plurality of detents in the edges.

18. The container of claim 14 wherein said base of said body member is provided with a fluted surface.

19. The container of claim 18 which further includes a protuberance on the top surface of said enclosure member that is adapted to interact with a wrench element for the purpose of applying a torque force to said enclosure member.

20. The container of claim 19 which further includes a flange on the top surface of said enclosure member that surrounds said protuberance.

21. A method for carrying and removing integrated circuit wafers from a container comprising:

providing a body member having a circular base, a flat upper surface on said base for supporting wafers in stacked relation, an arcuate upright member on said base adapted to encircle approximately 180° of a stack of wafers supported on said flat upper surface;

providing enclosure member having a circular top wall and a cylindrical wall adapted to mate with said body member to form a complete enclosure for wafers, a means to secure said enclosure member to said body member;

providing a cylindrically shaped retainer element to retain wafers positioned said enclosure member adapted to be placed on said base of said body member to encircle said arcuate upright member, and retainer element of a length approximately equal to the length of said arcuate upright member;

providing a diametral slot in the bottom surface of said base;

positioning a fixture for opening said container, wherein said fixture has a flat support panel, an upright abutment panel, and a ridge element on said support panel that interacts with said diametral slot in said base element to prevent rotation of said body member;

rotating said enclosure member until it can be removed from said base;

removing said retainer element; and removing said wafers from said container horizontally from said stack of wafers by means of a vacuum wafer handler.

22. The method of claim 20 and further providing a protuberance on the top surface of said enclosure member that is adapted to interact with means for the purpose of applying a torque force to said enclosure member and aid in removing said enclosure member.

23. The method of claim 22 wherein said protuberance is annular in shape with a plurality of detents in the edges.

* * * * *